(12) United States Patent
Ishino

(10) Patent No.: US 11,978,750 B2
(45) Date of Patent: May 7, 2024

(54) PHOTOELECTRIC CONVERSION DEVICE AND METHOD OF MANUFACTURING PHOTOELECTRIC CONVERSION DEVICE

(71) Applicant: CANON KABUSHIKI KAISHA, Tokyo (JP)

(72) Inventor: Hideaki Ishino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 458 days.

(21) Appl. No.: 17/096,353

(22) Filed: Nov. 12, 2020

(65) Prior Publication Data

US 2021/0167109 A1 Jun. 3, 2021

(30) Foreign Application Priority Data

Nov. 29, 2019 (JP) ................................. 2019-216673

(51) Int. Cl.
*H01L 27/14* (2006.01)
*H01L 27/146* (2006.01)

(52) U.S. Cl.
CPC .. *H01L 27/14623* (2013.01); *H01L 27/14636* (2013.01); *H01L 27/1464* (2013.01); *H01L 27/14643* (2013.01); *H01L 27/14685* (2013.01)

(58) Field of Classification Search
CPC ......... H01L 27/14623; H01L 27/14636; H01L 27/1464; H01L 27/14643; H01L 27/14685
See application file for complete search history.

(56) References Cited

U.S. PATENT DOCUMENTS 8,021,912 B2 * 9/2011 Kim .................. H01L 27/14643
438/90
8,508,634 B2 * 8/2013 Oshiyama ......... H01L 27/14645
348/222.1

(Continued)

FOREIGN PATENT DOCUMENTS

JP 6-140616 A 5/1994
JP 6-260628 A 9/1994

(Continued)

OTHER PUBLICATIONS

Notice of Reasons for Refusal in Japanese Application No. 2019-216673.

*Primary Examiner* — Mounir S Amer
*Assistant Examiner* — Alexander Belousov
(74) *Attorney, Agent, or Firm* — Venable LLP

(57) ABSTRACT

A photoelectric conversion device having a light-receiving pixel region and a light-shielded pixel region, the photoelectric conversion device comprising: a semiconductor layer; a first layered structure which is arranged on a first surface of the semiconductor layer in the light-receiving pixel region and in which at least an insulating layer and a metal oxide layer arranged between the semiconductor layer and the insulating layer are stacked; and a second layered structure which is arranged on the first surface of the semiconductor layer in the light-shielded pixel region and in which at least a light-shielding layer, a metal oxide layer arranged between the semiconductor layer and the light-shielding layer, a first insulating layer arranged between the metal oxide layer and the light-shielding layer, and a second insulating layer arranged between the first insulating layer and the light-shielding layer and including hydrogen are stacked.

22 Claims, 4 Drawing Sheets

(56) References Cited

U.S. PATENT DOCUMENTS

| | | | | |
|---|---|---|---|---|
| 8,729,450 | B2* | 5/2014 | Yoshitsugu | H01L 27/14685 257/432 |
| 9,653,502 | B2* | 5/2017 | Yoshitsugu | H01L 27/14685 |
| 9,998,691 | B2* | 6/2018 | Numata | H01L 27/14625 |
| 11,114,484 | B2* | 9/2021 | Ogino | H01L 27/14623 |
| 2009/0090988 | A1* | 4/2009 | Ohgishi | H01L 27/1464 438/73 |
| 2009/0189235 | A1* | 7/2009 | Ikeda | H01L 27/14645 257/E31.127 |
| 2009/0209058 | A1* | 8/2009 | Kim | H01L 27/14623 438/73 |
| 2011/0025872 | A1* | 2/2011 | Oshiyama | H01L 27/14645 348/222.1 |
| 2016/0005782 | A1* | 1/2016 | Aoki | H01L 27/14636 257/435 |
| 2016/0269655 | A1* | 9/2016 | Numata | H01L 27/1461 |
| 2019/0103426 | A1* | 4/2019 | Tanaka | H01L 27/14685 |
| 2019/0371836 | A1* | 12/2019 | Ogino | H01L 27/14627 |
| 2020/0177829 | A1* | 6/2020 | Takahashi | H04N 25/76 |
| 2021/0167109 | A1* | 6/2021 | Ishino | H01L 27/14643 |
| 2021/0313369 | A1* | 10/2021 | Tange | H01L 27/1464 |
| 2023/0074553 | A1* | 3/2023 | Ishino | H01L 27/14623 |

FOREIGN PATENT DOCUMENTS

| | | |
|---|---|---|
| JP | 2010-016128 A | 1/2001 |
| JP | 2011-35204 A | 2/2011 |
| JP | 2012-191005 A | 10/2012 |
| JP | 2016-18859 A | 2/2016 |
| JP | 2018-6415 A | 1/2018 |
| JP | 2019-212737 A | 12/2019 |

\* cited by examiner

PHOTOELECTRIC CONVERSION DEVICE AND METHOD OF MANUFACTURING PHOTOELECTRIC CONVERSION DEVICE

BACKGROUND OF THE INVENTION

Field of the Invention

The present invention relates to a photoelectric conversion device and a method of manufacturing the photoelectric conversion device.

Description of the Related Art

A back-illuminated solid-state image capturing element (photoelectric conversion device) is provided with a light-receiving pixel region and a light-shielded pixel (hereinafter, OB pixel) region. The light-receiving pixel region is a region in which the incident light reaches a pixel (photodiode). The OB pixel region is a region in which incident light is blocked before reaching the pixel. High-precision image capturing is made possible by removing dark noise by the difference between the data acquired by these two pixels.

Further, in the back-illuminated solid-state image capturing element, the surface of a semiconductor substrate opposite to the surface on which a photoelectric conversion portion is formed is a light incident surface. Since the light incident surface is the interface between the semiconductor substrate and other materials, it becomes a source of dark current (current that flows even without light).

A method for reducing the dark current generated on the light incident surface is known in which a metal oxide layer having high-density fixed charges is formed on the light incident surface, and the dark current source is inactivated by a charge accumulation effect of the metal oxide layer. Where electrons are used as a signal charge, the polarity of the fixed charge is negative, and the dark current source can be inactivated by accumulating the positive charge. A hafnium oxide layer, an aluminum oxide layer, or a tantalum oxide layer have been used as the metal oxide layer.

However, even if a metal oxide layer (metal oxide film) having a function of reducing the dark current is formed over the entire pixel region, the effect of the dark current level in the OB pixel region becoming higher than that in the light-receiving pixel region (so-called OB step) still occurs, and the pixel performance deteriorates. Accordingly, Japanese Patent Application Publication No. 2012-191005 describes a technique for suppressing the OB step between the two regions by forming a metal oxide layer thicker in the OB pixel region than in the light-receiving pixel region.

Meanwhile, from the viewpoint of preventing the malfunction of a transistor in a peripheral circuit region, the influence of the metal oxide layer having a fixed charge needs to be small. Therefore, a method of arranging an insulating layer including hydrogen (hydrogen-containing insulating layer) in the OB pixel region to inactivate the dark current source itself by hydrogen of the hydrogen-containing insulating layer can be considered. Here, some hydrogen-containing insulating layers have a positive fixed charge, examples thereof being a silicon nitride layer, a silicon oxynitride layer, and a silicon oxide layer formed by plasma CVD. A hydrogen-containing insulating layer having such a positive fixed charge also has a charge accumulation effect. However, since the negative charge is accumulated, the metal oxide layer acts in the direction of canceling the charge accumulation effect. Therefore, arranging such a hydrogen-containing insulating layer in the OB pixel region is not desirable from the viewpoint of reducing the OB step (that is, suppressing the deterioration of pixel performance).

SUMMARY OF THE INVENTION

Therefore, the purpose of the present technique is to suppress the deterioration of pixel performance in a photoelectric conversion device.

A first aspect of the present technique is:
a photoelectric conversion device having a light-receiving pixel region and a light-shielded pixel region, the photoelectric conversion device comprising:
a semiconductor layer having a first surface and a second surface opposite to the first surface;
a first layered structure which is arranged on the first surface of the semiconductor layer in the light-receiving pixel region and in which at least an insulating layer and a metal oxide layer arranged between the semiconductor layer and the insulating layer are stacked; and
a second layered structure which is arranged on the first surface of the semiconductor layer in the light-shielded pixel region and in which at least a light-shielding layer, a metal oxide layer arranged between the semiconductor layer and the light-shielding layer, a first insulating layer arranged between the metal oxide layer and the light-shielding layer, and a second insulating layer arranged between the first insulating layer and the light-shielding layer and including hydrogen are stacked.

A second aspect of the present technique is:
a method of manufacturing a photoelectric conversion device having a light-receiving pixel region and a light-shielded pixel region,
the photoelectric conversion device including:
a semiconductor layer having a first surface and a second surface opposite to the first surface;
a first layered structure which is arranged on the first surface of the semiconductor layer in the light-receiving pixel region and in which at least an insulating layer and a metal oxide layer arranged between the semiconductor layer and the insulating layer are stacked; and
a second layered structure which is arranged on the first surface of the semiconductor layer in the light-shielded pixel region and in which at least a light-shielding layer, a metal oxide layer arranged between the semiconductor layer and the light-shielding layer, a first insulating layer arranged between the metal oxide layer and the light-shielding layer, and a second insulating layer arranged between the first insulating layer and the light-shielding layer and including hydrogen are stacked, wherein
the method comprises:
a step of forming the first insulating layer by plasma-enhanced chemical vapor deposition (PECVD) and
a step of forming the second insulating layer.

Further features of the present invention will become apparent from the following description of exemplary embodiments with reference to the attached drawings.

DESCRIPTION OF THE EMBODIMENTS

Figure 1:
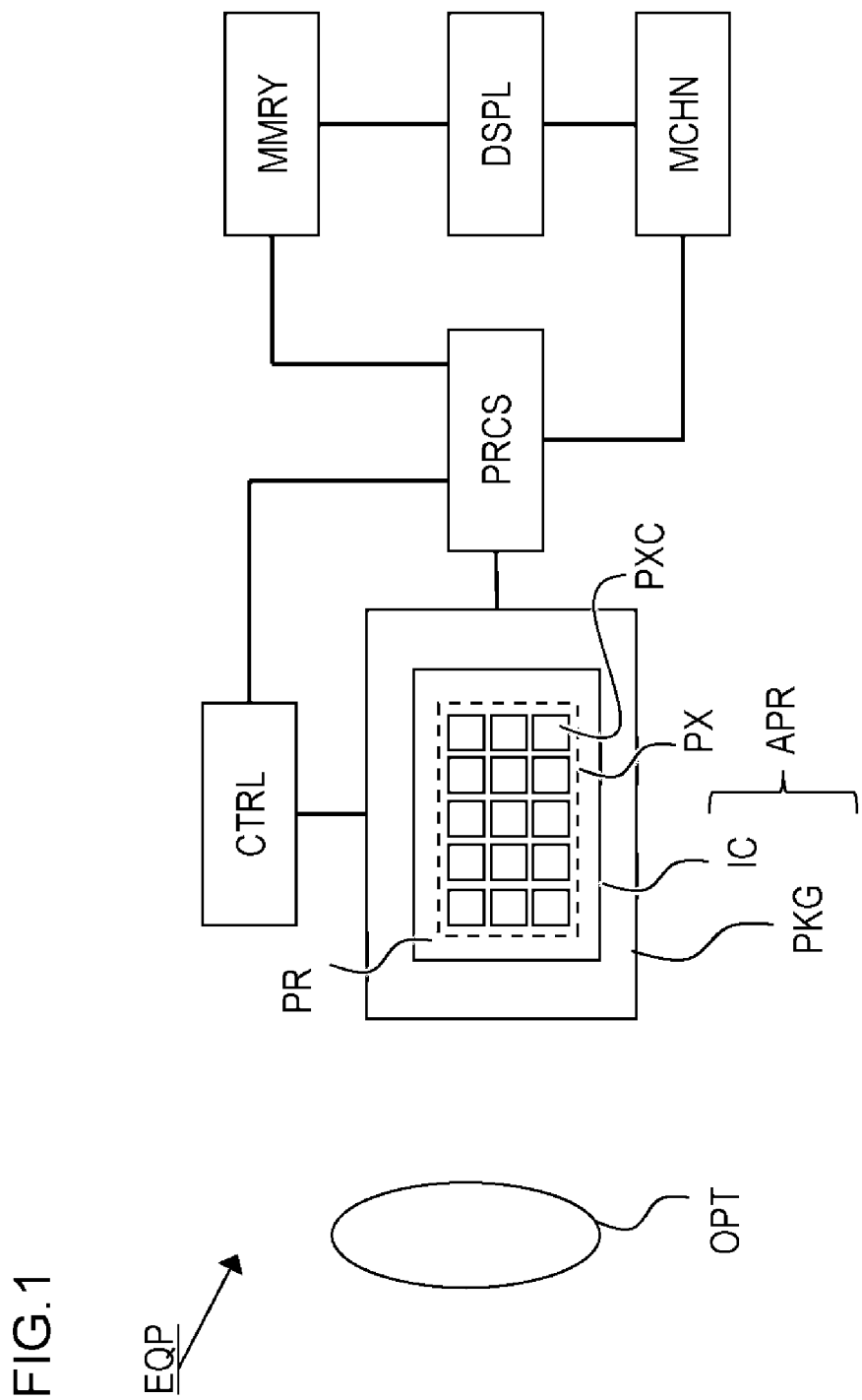
FIG. 1 is a schematic diagram showing a semiconductor device according to Embodiment 1.

Hereinafter, embodiments of the present invention will be described with reference to the drawings. In the following description and drawings, common reference numerals are given to common configurations in a plurality of drawings. Therefore, a plurality of drawings will be cross-referred to explain a common configuration, and the explanation of configurations with common reference numerals will be omitted as appropriate.

Embodiment 1

FIG. 1 is a schematic diagram illustrating a semiconductor device APR according to the present embodiment. The semiconductor device APR includes a semiconductor device IC including a first semiconductor substrate 100 and a second semiconductor substrate 200, and also a package PKG for mounting the semiconductor device IC. In the present embodiment, the semiconductor device APR is a solid-state image capturing element (photoelectric conversion device). The semiconductor device IC has a pixel region PX in which pixel circuits PXC are arranged in a matrix, and a peripheral region PR around the pixel region. A peripheral circuit may be provided in the peripheral region PR.

In addition, the semiconductor device APR is provided in an apparatus EQP. Here, the apparatus EQP may include at least one of an optical system OPT, a control device CTRL, a processing device PRCS, a display device DSPL, a storage device MMRY, and a mechanical device MCHN. The apparatus EQP will be described in detail hereinbelow.

Figure 2:
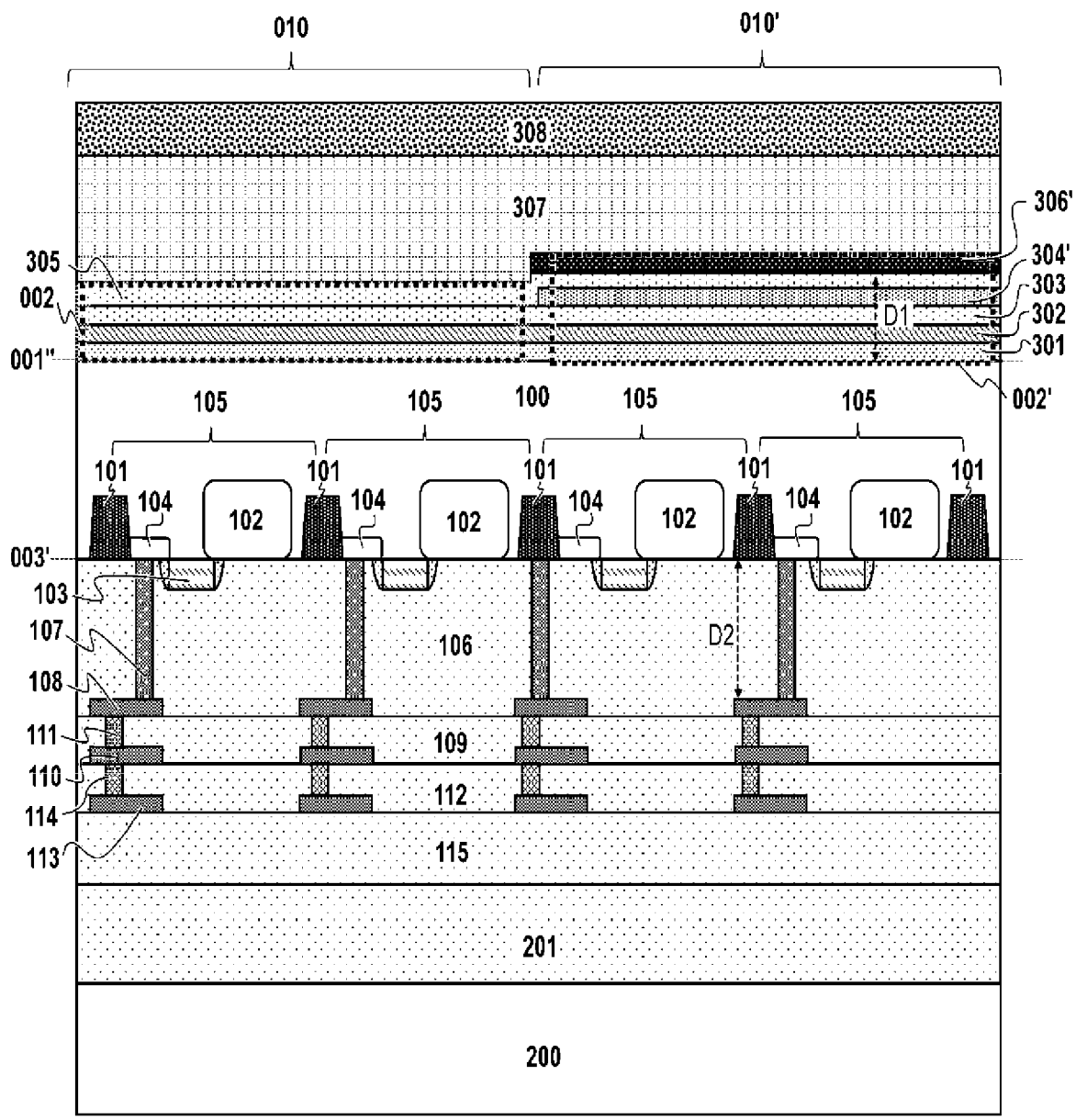
FIG. 2 is a cross-sectional view of a solid-state image capturing element according to Embodiment 1.

FIG. 2 is a schematic cross-sectional view of a solid-state image capturing element (photoelectric conversion device) which is an example of the semiconductor device APR according to Embodiment 1. The solid-state image capturing element includes a first semiconductor substrate 100 (first semiconductor layer) and a second semiconductor substrate 200 (second semiconductor layer). A plurality of insulating layers and a plurality of wiring layers are arranged between the first semiconductor substrate 100 and the second semiconductor substrate 200. Hereinafter, unless otherwise specified, the insulating layer is a silicon oxide layer, a silicon nitride layer, a silicon oxynitride layer, a carbon-containing silicon oxide layer, a fluorine-containing silicon oxide layer, or the like. Hereinafter, the direction (position) in which the first semiconductor substrate 100 is present with respect to the second semiconductor substrate 200 is referred to as "an (the) upper side". In the present embodiment, light is incident on the first semiconductor substrate 100 from the upper side thereof.

Internal Configuration of First Semiconductor Substrate

In the first semiconductor substrate 100, an interface 001" (first surface) is a light incident surface, and pixels 105 are provided at a (paired) interface 003' (second surface) opposite the interface 001". The second semiconductor substrate 200 is arranged on the interface 003' side (second surface side) of the first semiconductor substrate 100.

The pixel 105 includes an element separation 101, a photodiode 102, a transfer electrode 103, a diffusion layer 104, and other transistors (not shown).

The element separation 101 has an STI structure. The element separation 101 defines an element region (active region) of the first semiconductor substrate 100. The photodiode 102 is a photoelectric conversion unit that converts light into an electric charge. The transfer electrode 103 transfers the charge of the photodiode 102 to the diffusion layer 104.

It is also possible to provide the first semiconductor substrate 100 with elements other than the elements shown in FIG. 2. For example, the elements other than the elements shown in FIG. 2 are transistors, capacitors, resistors, and the like that form a peripheral circuit region responsible for signal processing.

A light-receiving pixel region 010 is a region where light is incident on the pixels. The pixel 105 belonging to the light-receiving pixel region 010 is a light-receiving pixel onto which light is incident. Meanwhile, a light-shielded pixel region 010' is a region in which the incidence of light on the pixels is blocked. The pixel 105 belonging to the light-shielded pixel region 010' is a light-shielded pixel in which light is blocked by a light-shielding layer described hereinbelow.

Configuration Below First Semiconductor Substrate

Below an interface 003' of the first semiconductor substrate 100, a first interlayer insulating layer 106, contact plugs 107, and a first wiring layers 108 are provided. Below the first interlayer insulating layer 106, a second interlayer insulating layer 109, a second wiring layer 110, and plugs 111 (plugs connecting the first wiring layer 108 and the second wiring layer 110) are provided. Further, below the second interlayer insulating layer 109, a third interlayer insulating layer 112, a third wiring layer 113, and plugs 114 (plugs connecting the second wiring layer 110 and the third wiring layer 113) are provided. Further, an insulating layer 115 is provided below the third interlayer insulating layer 112. The insulating layer 115 is bonded to an insulating layer 201 provided on the second semiconductor substrate 200.

The first semiconductor substrate 100 and the second semiconductor substrate 200 are integrated by joining the first semiconductor substrate 100 and the second semiconductor substrate 200 through such a plurality of insulating layers. In the present embodiment, three wiring layers of the first wiring layer 108, the second wiring layer 110, and the third wiring layer 113 are formed, but this number of wiring layers is not limiting, and the wiring layers may be added or removed as needed. Further, each wiring layer and each plug can be formed of a conductor such as aluminum.

Further, in the present embodiment, no element is provided in the second semiconductor substrate 200, but an element may be provided. In this case, an interconnection wiring for communicating an electric signal between the element of the first semiconductor substrate 100 and the element of the second semiconductor substrate 200 is provided. A hybrid bonding structure, a TSV structure and the like can be used as a structure forming a part of the interconnection wiring. In the case of the hybrid bonding structure, electrode pads are provided on the insulating layer 115 and the insulating layer 201, and the electrode pads form bonding surfaces in addition to the bonding surfaces of the insulating layer 115 and the insulating layer 201. Further, in a case where the element is not to be formed in the second semiconductor substrate 200, a glass substrate or the like which is a simple support substrate may be used instead of the second semiconductor substrate 200.

Configuration in Upper Side of First Semiconductor Substrate

Further, a first layered structure 002 is provided in the light-receiving pixel region 010 on the interface 001" (on the first surface). A second layered structure 002' is provided in the light-shielded pixel region 010' on the interface 001" (on the first surface). Further, the first layered structure 002 and the second layered structure 002' further include an insulating layer 307. An optical structure 308 is provided in the upper side of the insulating layer 307 of the first layered structure 002 and the second layered structure 002'.

The first layered structure 002 includes a metal oxide layer 301, a dielectric layer 302, an insulating layer 303, and an insulating layer 305. The second layered structure 002' includes the metal oxide layer 301, the dielectric layer 302, the insulating layer 303, an insulating layer 304', the insulating layer 305, and a light-shielding layer 306'. Here, the first layered structure 002 and the second layered structure 002" include the metal oxide layer 301, the insulating layer 303, and the insulating layer 305 that are shared by the layered structures.

The metal oxide layer 301 is provided on the interface 001" which is the light incident surface. The metal oxide layer 301 functions as a fixed charge layer having a negative fixed charge. Therefore, the metal oxide layer 301 reduces the dark current at the interface 001". The metal oxide layer 301 straddles both the light-receiving pixel region 010 and the light-shielded pixel region 010'. The metal oxide layer 301 is, for example, a hafnium oxide layer, an aluminum oxide layer, or the like. Where the metal oxide layer 301 is an aluminum oxide layer, the hydrogen concentration in the metal oxide layer 301 is close to $10^{21}$ atoms/cm$^3$. The metal oxide layer 301 can also function as an insulating layer.

The dielectric layer 302 is provided in the upper side of the metal oxide layer 301. The dielectric layer 302 functions as an antireflection layer. A layer having a higher refractive index than the metal oxide layer 301 is selected for the dielectric layer 302. The dielectric layer 302 is, for example, a tantalum oxide layer which is an oxide compound. Where the dielectric layer 302 is a tantalum oxide layer, the dielectric layer 302 itself also functions as a fixed charge layer having a negative fixed charge. The dielectric layer 302 is also an insulating layer. The dielectric layer 302 straddles both the light-receiving pixel region 010 and the light-shielded pixel region 010'. Further, the thickness of the dielectric layer 302 is larger than that of the metal oxide layer 301. The dielectric layer 302 is not an essential configuration and may not be formed.

The insulating layer 303 is provided in the upper side of the dielectric layer 302. The insulating layer 303 is also a dielectric layer. The insulating layer 303 straddles both the light-receiving pixel region 010 and the light-shielded pixel region 010'. The insulating layer 303 is, for example, a silicon oxide layer (a layer that is an oxide compound and is a silicon compound).

The insulating layer 304' is an insulating layer including hydrogen. The insulating layer 304' is provided in the upper side of the insulating layer 303 in the light-shielded pixel region 010'. The dark current source is inactivated by the hydrogen in the insulating layer 304'. The insulating layer 304' can be an oxide compound, a nitride compound, a silicon compound, or the like. Specifically, the insulating layer 304' can be any layer including hydrogen selected from a silicon oxide layer, a silicon nitride layer, a silicon nitride oxide layer, and an aluminum oxide layer. Further, the metal oxide layer 301, the dielectric layer 302 and the insulating layer 303 can all include hydrogen, but the hydrogen concentration in the insulating layer 304' is higher (larger) than the hydrogen concentration in these three layers and is preferably $10^{21}$ atoms/cm$^3$ or more. Where the metal oxide layer 301 is an aluminum oxide layer, the hydrogen concentration of the insulating layer 304' may be $10^{22}$ atoms/cm$^3$ or more in order to make the hydrogen concentration higher than that of the metal oxide layer 301.

The insulating layer 305 is provided in the upper side of the insulating layer 303 and the insulating layer 304' of the light-receiving pixel region 010. The insulating layer 305 straddles both the light-receiving pixel region 010 and the light-shielded pixel region 010'.

The light-shielding layer 306' is provided in the upper side of the insulating layer 305 in the light-shielded pixel region 010'. The light-shielding layer 306' blocks the incident light from reaching the pixels. The light-shielding layer 306' is, for example, a tungsten layer, a titanium nitride layer, an aluminum alloy layer, or the like.

In order to prevent light such as stray light from entering the interface 001" in the light-shielded pixel region 010', a shorter distance (interval; shortest distance) from the light-shielding layer 306' to the interface 001" is preferable. Specifically, where the distance of the light-shielding layer 306' from the interface 001" is denoted by D1 and the distance from the interface 003' to the first wiring layer 108 is denoted by D2, D1 needs to be less than D2. Here, the first wiring layer 108 is the wiring layer closest to the interface 003' among the plurality of wiring layers arranged between the first semiconductor substrate 100 and the second semiconductor substrate 200.

The insulating layer 307 is provided in the upper side of the insulating layer 305 and the light-shielding layer 306' in the light-receiving pixel region 010. The insulating layer 307 straddles both the light-receiving pixel region 010 and the light-shielded pixel region 010'.

The optical structure 308 is provided in the upper side of the insulating layer 307 and guides the incident light to each pixel. The optical structure 308 includes an intralayer lens, a color filter, a microlens, and the like, but details thereof are omitted.

Here, the first layered structure 002 and the second layered structure 002' are compared. The second layered structure 002' includes one insulating layer 304' that the first layered structure 002 does not include. Further, in the second layered structure 002', an insulating layer 303 is provided between the metal oxide layer 301 (and the dielectric layer 302) and the insulating layer 304'. Here, the dielectric layer 302 can also function as a metal oxide layer depending on the material. The insulating layer arranged between the metal oxide layer 301 and the insulating layer 304' does not have to be one layer, and may be a plurality of layers.

As described above, in the present embodiment, in the second layered structure 002', the insulating layer 303 is present between the metal oxide layer 301 and the insulating layer 304'. As a result, even if the fixed charges of the metal oxide layer 301 and the insulating layer 304' have different polarities (reverse polarities), the insulating layer 303 separates the insulating layer 304' from the interface 001". Therefore, the charge accumulation effect of the insulating layer 304' is alleviated. Therefore, the hydrogen-containing insulating layer can be arranged in the light-shielded pixel region regardless of the polarity of the fixed charge of the hydrogen-containing insulating layer, and the OB step can be reduced. Therefore, the deterioration of the pixel performance can be suppressed. The insulating layer 303 itself has a fixed charge to some extent. Where the insulating layer 303 is a silicon oxide layer, the insulating layer 303 often has a positive fixed charge. In this case, the fixed charge density of the insulating layer 303 is preferably as low as possible, and desirably needs to be one order of magnitude or more lower than the fixed charge density of the metal oxide layer 301.

Apparatus EQP

Hereinafter, the apparatus EQP provided with the semiconductor device APR and shown in FIG. 1 will be described in detail. Here, as described above, in addition to the semiconductor device IC having the first semiconductor substrate 100, the semiconductor device APR can include the package PKG accommodating the semiconductor device IC. The package PKG can include a substrate to which the semiconductor device IC is fixed, a lid such as glass facing the semiconductor device IC, and a connecting member such as a bonding wire or bump that connects a terminal provided on the substrate and a terminal provided on the semiconductor device IC.

The apparatus EQP can include at least one of the optical system OPT, the control device CTRL, the processing device PRCS, the display device DSPL, and the storage device MMRY. The optical system OPT forms an image on the semiconductor device APR and is, for example, a lens, a shutter, or a mirror. The control device CTRL controls the semiconductor device APR and is, for example, a photoelectric conversion device such as an ASIC.

The processing device PRCS processes the signal output from the semiconductor device APR, and is a photoelectric conversion device such as a CPU or an ASIC for forming an analog front end (AFE) or a digital front end (DFE). The display device DSPL is an EL display device or a liquid crystal display device that displays information (images) obtained by the semiconductor device APR. The storage device MMRY is a magnetic device or a semiconductor device that stores information (images) obtained by the semiconductor device APR. The storage device MMRY is a volatile memory such as SRAM or DRAM, or a non-volatile memory such as a flash memory or a hard disk drive.

The mechanical device MCHN has a moving part or a propulsion part such as a motor or an engine. In the apparatus EQP, the signal output from the semiconductor device APR is displayed on the display device DSPL, or transmitted to the outside by a communication device (not shown) included in the apparatus EQP. Therefore, it is preferable that the apparatus EQP further include the storage device MMRY and the processing device PRCS in addition to the storage circuit and the computational circuit of the semiconductor device APR. The mechanical device MCHN may be controlled based on the signal output from the semiconductor device APR.

In addition, the apparatus EQP is suitable for electronic equipment such as information terminals (for example, smartphones and wearable terminals) and cameras (for example, interchangeable lens cameras, compact cameras, video cameras, surveillance cameras) having an image capturing function. The mechanical device MCHN in the camera can drive the components of the optical system OPT for zooming, focusing, and shutter operation.

Further, the apparatus EQP can be a transportation equipment such as a vehicle, a ship, or an air vehicle. The mechanical device MCHN in the transportation equipment can be used as a mobile device. The apparatus EQP as a transportation device is suitable for transporting the semiconductor device APR and for assisting and/or automating operation (maneuvering) by the image capturing function. The processing device PRCS for assisting and/or automating the operation (steering) can perform processing for operating the mechanical device MCHN as a mobile device based on the information obtained by the semiconductor device APR. Alternatively, the apparatus EQP may be a medical device such as an endoscope, a measuring device such as a distance measuring sensor, or an analytical device such as an electron microscope.

Therefore, by using the semiconductor device (solid-state image capturing element) according to the present embodiment, it is possible to improve the performance of the semiconductor device. Therefore, for example, when a semiconductor device is mounted on a transportation equipment to capture an image of the outside of the transportation equipment or measure an external environment, excellent image quality and measurement accuracy can be obtained. Therefore, in manufacturing and selling the transportation equipment, it is advantageous to decide to mount the semiconductor device according to the present embodiment on the transportation equipment in order to improve the performance of the transportation equipment itself.

Embodiment 2

Hereinafter, the solid-state image capturing element (photoelectric conversion device) according to Embodiment 2 in which only the configurations of the first layered structure 002 and the second layered structure 002' in the semiconductor device APR (solid-state image capturing element) according to Embodiment 1 are changed will be described.

Figure 3:
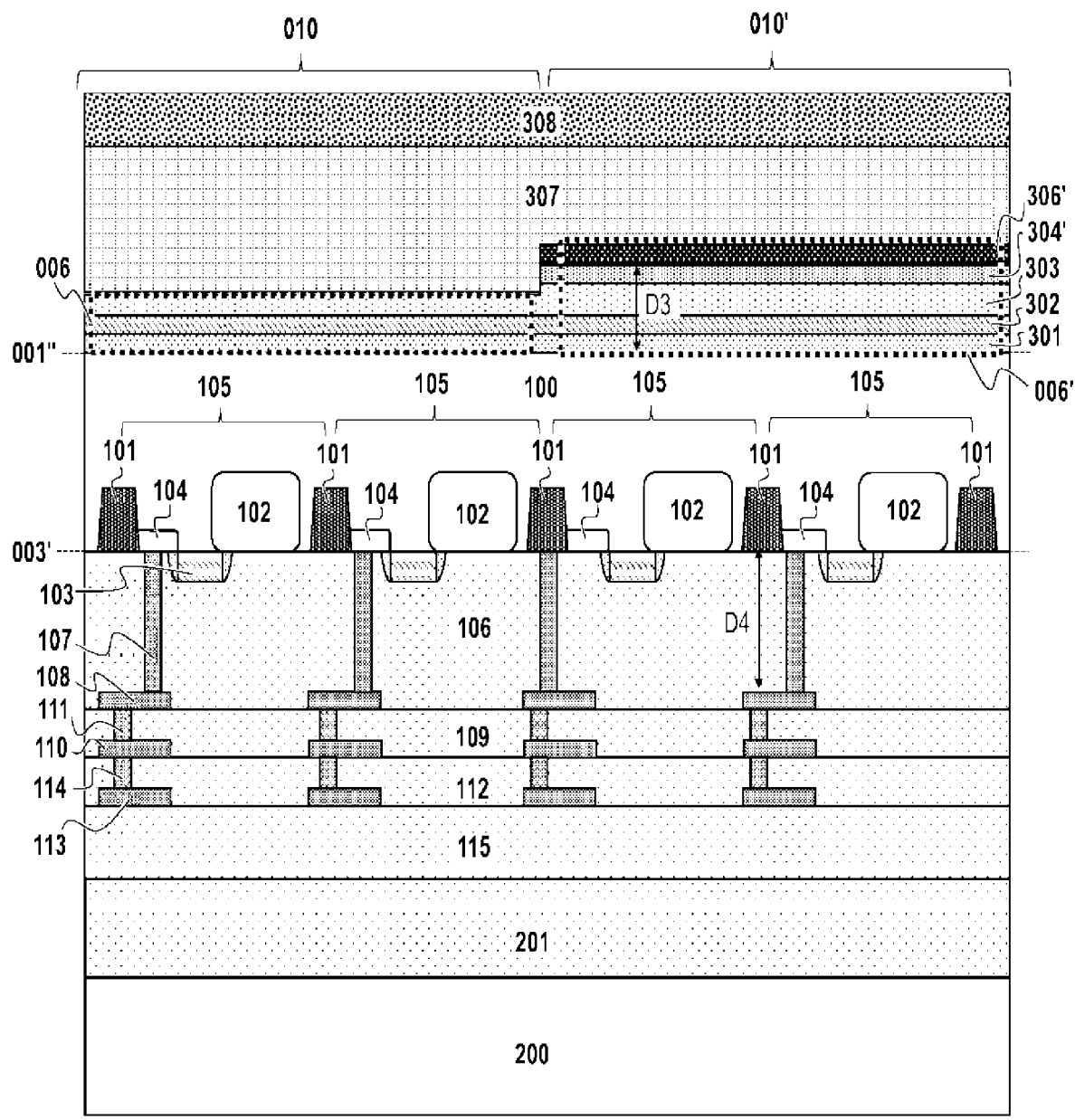
FIG. 3 is a cross-sectional view of a solid-state image capturing element according to Embodiment 2.

FIG. 3 is a schematic cross-sectional view of the solid-state image capturing element according to Embodiment 2. The configurations inside the first semiconductor substrate 100 and below the first semiconductor substrate 100 in the solid-state image capturing element according to the present embodiment are the same as those of the solid-state image capturing element according to Embodiment 1, and thus the description thereof will be omitted. Further, the same components as those in Embodiment 1 are denoted by the same reference numerals in the present embodiment.

In the present embodiment, a first layered structure 006 are provided in the light-receiving pixel region 010 on the interface 001" and a second layered structure 006' are provided in the light-shielded pixel region 010' on the interface 001". Further, the optical structure 308 is provided above the insulating layer 307 of the first layered structure 006 and the second layered structure 006'.

The first layered structure 006 includes the metal oxide layer 301, the dielectric layer 302, and the insulating layer 303. The second layered structure 006' includes the metal oxide layer 301, the dielectric layer 302, the insulating layer 303, the insulating layer 304', and the light-shielding layer 306'. That is, in the present embodiment, unlike Embodiment 1, the insulating layer 305 is not provided in either the first layered structure 006 or the second layered structure 006'. Further, the metal oxide layer 301 and the insulating layer 303 are commonly included in the first layered structure 006 and the second layered structure 006'.

The insulating layer 303 is provided in the upper side of the dielectric layer 302. In the present embodiment, the insulating layer 303 straddles both the light-receiving pixel region 010 and the light-shielded pixel region 010'.

The insulating layer 304' is provided in the upper side of the insulating layer 303 in the light-shielded pixel region 010'. The insulating layer 304' is not provided in the light-receiving pixel region 010. The light-shielding layer 306' is provided in the upper side of the insulating layer 304' so as to be in contact with the insulating layer 304'.

Where the distance of the light-shielding layer 306' from the interface 001" is denoted by D3 and the distance from the interface 003' to the first wiring layer 108 is denoted by D4, D3 is preferably less than D4 in order to suppress the incidence of light on the interface 001" in the light-shielded pixel region 010'.

Here, the first layered structure 006 and the second layered structure 006' are compared. The second layered structure 006' includes one insulating layer 304' that is not included in the first layered structure 006. Further, in the second layered structure 006', the insulating layer 304' and the light-shielding layer 306' are in contact with each other. Further, an insulating layer 303 is provided between the metal oxide layer 301 and the insulating layer 304'. With such a configuration, the distance between the insulating layer 304' and the interface 001" can be increased. This alleviates the charge accumulation effect of the insulating layer 304', and the deterioration of pixel performance can be suppressed even though the fixed charges of the metal oxide layer 301 and the insulation layer 304' have different polarities (reverse polarities).

Further, in order to ensure a greater electric field relaxation effect, it is desirable to increase the thickness of the insulating layer 303, but where the insulating layer 303 is thickened, the distance from the interface 001", which is the light incident surface, to the light-shielding layer 306' is increased, and the problem of stray light can occur. In the structure of the present embodiment, the insulating layer 304' and the light-shielding layer 306' are in contact with each other. Therefore, the thickness of the insulating layer 303 can be increased while suppressing an increase in the distance from the interface 001" to the light-shielding layer 306'. In this way, the hydrogen-containing insulating layer can be arranged in the light-shielded pixel region regardless of the polarity of the fixed charge of the hydrogen-containing insulating layer while suppressing the stray light, and the OB step can be reduced, so that the deterioration of pixel performance can be further suppressed.

Here, a more specific example of the configuration in the upper side of the first semiconductor substrate 100 according to the present embodiment will be described. As described hereinabove, in the first layered structure 006 arranged in the upper side of the interface 001" of the first semiconductor substrate 100, the metal oxide layer 301, the dielectric layer 302, and the insulating layer 303 are stacked in this order from the interface 001", and the insulating layer 307 is further formed in the upper side thereof. Further, in the second layered structure 006', the metal oxide layer 301, the dielectric layer 302, the insulating layer 303, the insulating layer 304', and the light-shielding layer 306' are stacked in this order from the interface 001", and the insulating layer 307 is further formed in the upper side of the light-shielding layer 306' of the second layered structure 006'.

That is, in the first layered structure 006, the insulating layer 303 is located at a position farther from the interface 001" than the dielectric layer 302, and the dielectric layer 302 is located at a position farther from the interface 001" than the metal oxide layer 301. Further, in the second layered structure 006', the light-shielding layer 306' is located at a position farther from the interface 001" than the insulating layer 304', and the insulating layer 304' is located at a position farther from the interface 001" than the insulating layer 303. In the second layered structure 006', the insulating layer 303 is located at a position farther from the interface 001" than the dielectric layer 302, and the dielectric layer 302 is located at a position farther from the interface 001" than the metal oxide layer 301.

In other words, in the first layered structure 006, the insulating layer 303 and the metal oxide layer 301 arranged between the first semiconductor substrate 100 and the insulating layer 303 are at least stacked. In the second layered structure 006', the light-shielding layer 306', the metal oxide layer 301 arranged between the first semiconductor substrate 100 and the light-shielding layer 306', and the insulating layer 303 arranged between the metal oxide layer 301 and the light-shielding layer 306' are at least stacked. Further, in the second layered structure 006', the insulating layer 304' arranged between the insulating layer 303 and the light-shielding layer 306' is at least stacked. The insulating layer 303 in the first layered structure 006 and the insulating layer 303 in the second layered structure 006' do not have to be common (integrated), and may be different insulating layers.

Regarding the thickness of the layers, it is desirable that the relationship of light-shielding layer 306'>insulating layer 303>insulating layer 304'≈dielectric layer 302>metal oxide layer 301 is established.

The metal oxide layer 301 is formed (composed) of $Al_2O_3$ having a thickness of 5 mm to 20 nm (at least 5 nm and not more than 20 nm), and preferably 10 nm. The dielectric layer 302 is formed (composed) of $Ta_2O_5$ having a thickness of 25 nm to 100 nm (at least 25 nm and not more than 100 nm), and preferably 50 nm. The insulating layer 303 is formed (composed) of P—SiO (silicon oxide formed by PECVD) having a thickness of 70 nm to 280 nm (at least 70 nm and not more than 280 nm), and preferably 140 nm. Since the insulating layer 303 in the first layered structure 006 is shaved off by the etching performed when the insulating layer 304' is formed, the thickness of the insulating layer 303 of the first layered structure 006 is less than that of the insulating layer 303 of the second layered structure 006'. That is, the insulating layer 303 in the second layered structure 006' preferably has a thickness of 140 nm, and the insulating layer 303 in the first layered structure 006 preferably has a thickness of less than 140 nm. The insulating layer 304' is formed (composed) of P—SiN (silicon nitride formed by the PECVD method) including hydrogen and having a thickness of 25 nm to 100 nm (at least 25 nm and not more than 100 nm), preferably 50 nm. The light-shielding layer 306' is formed (composed) of AlCu having a thickness of 100 nm to 400 nm (at least 100 nm and not more than 400 nm), preferably 200 nm. Here, W (tungsten) may be used for the light-shielding layer 306', and a Ti/TiN structure may be provided in the upper or lower side of the light-shielding layer 306'. Further, the insulating layer 307 is formed (composed) of P—SiO.

Therefore, in the case of manufacturing the semiconductor device APR, the manufacturing method can include a step of forming the metal oxide layer 301 of $Al_2O_3$, a step of forming the dielectric layer 302 of $Ta_2O_5$, and a step of forming the insulating layer 303 of P—SiO. Further, the manufacturing method may include a step of forming the insulating layer 304' of P—SiN, a step of forming the light-shielding layer 306' of AlCu, and a step of forming the insulating layer 307 of P—SiO.

The insulating layer 303 is formed by plasma-enhanced chemical vapor deposition (PECVD) in the manufacturing process. By forming the layer with PECVD, it is possible to set the fixed charge density in the insulating layer 303 to a sufficiently low value close to $10^{10}$ $cm^{-2}$. Therefore, it is possible to form (manufacture) a semiconductor device APR suitable for suppressing the deterioration of pixel performance.

The insulating layer 304' may be formed of P—SiON including hydrogen. Further, the insulating layer 303 may be formed by normal pressure chemical vapor deposition (CVD) or quasi-normal pressure CVD. When formed in this way, the fixed charge density can be set to a sufficiently low value, as in the case where the insulating layer 303 is formed by PECVD.

Figure 4:
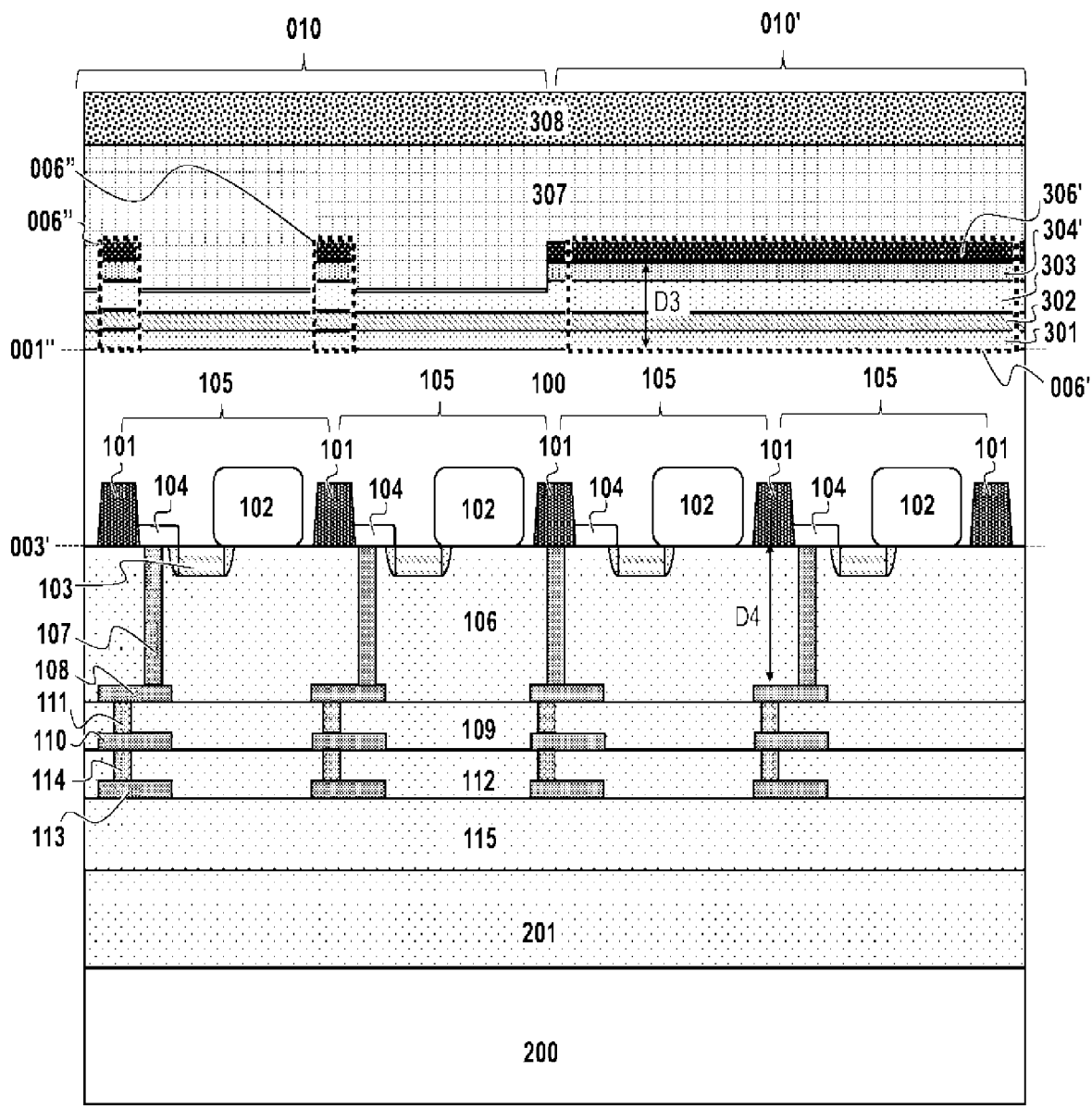
FIG. 4 is a cross-sectional view of another solid-state image capturing element according to Embodiment 2.

Further, as shown in FIG. 4, a layered structure 006" similar to the second layered structure 006' may be arranged in a grid shape between the pixels in the light-receiving pixel region 010 (in the upper side of the element separations 101). At this time, the width of the layered structure 006" may be about the same as that of the element separation 101. This configuration can be likewise applied to Embodiment 1.

Thus, it is possible to provide an advantageous technique for suppressing the deterioration of pixel performance in a photoelectric conversion device.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-216673, filed on Nov. 29, 2019, which is hereby incorporated by reference herein in its entirety.

What is claimed is:

1. A photoelectric conversion device having a light-receiving pixel region and a light-shielded pixel region, the photoelectric conversion device comprising:
a semiconductor layer having a first surface and a second surface opposite to the first surface;
a first layered structure arranged on a side of the first surface of the semiconductor layer in the light-receiving pixel region and in which at least an insulating layer and a metal oxide layer arranged between the semiconductor layer and the insulating layer are stacked;
a second layered structure arranged on the side of the first surface of the semiconductor layer in the light-shielded pixel region and in which at least a light-shielding layer, a metal oxide layer arranged between the semiconductor layer and the light-shielding layer, a first insulating layer arranged between the metal oxide layer and the light-shielding layer, and a second insulating layer arranged between the first insulating layer and the light-shielding layer and including hydrogen are stacked;
a substrate arranged on a side of the second surface of the semiconductor layer; and
a third layered structure arranged between the semiconductor layer and the substrate and in which a plurality of insulating layers and a plurality of wiring layers are stacked,
wherein a distance between the first surface and the light-shielding layer is shorter than a distance between the second surface and the wiring layer closest to the second surface among the plurality of wiring layers.

2. The photoelectric conversion device according to claim 1, wherein the first layered structure does not include the second insulating layer.

3. The photoelectric conversion device according to claim 1, wherein the second insulating layer and the light-shielding layer are in contact with each other in the second layered structure.

4. The photoelectric conversion device according to claim 1, wherein a third insulating layer is arranged between the second insulating layer and the light-shielding layer in the second layered structure.

5. The photoelectric conversion device according to claim 1, wherein the metal oxide layer functions as a fixed charge layer.

6. The photoelectric conversion device according to claim 1, wherein a hydrogen concentration in the second insulating layer is higher than a hydrogen concentration in the first insulating layer and the metal oxide layer.

7. The photoelectric conversion device according to claim 1, wherein a hydrogen concentration in the second insulating layer is $10^{21}$ atoms/cm$^3$ or more.

8. The photoelectric conversion device according to claim 7, wherein the hydrogen concentration in the second insulating layer is $10^{22}$ atoms/cm$^3$ or more.

9. The photoelectric conversion device according to claim 1, wherein the metal oxide layer is formed of aluminum oxide, and the first insulating layer is formed of silicon oxide.

10. The photoelectric conversion device according to claim 1, wherein the second insulating layer is a silicon compound.

11. The photoelectric conversion device according to claim 10, wherein the second insulating layer is formed of silicon nitride or silicon oxynitride.

12. The photoelectric conversion device according to claim 1, wherein the light-shielding layer is formed of aluminum or tungsten.

13. The photoelectric conversion device according to claim 1, wherein the second insulating layer is thicker than the metal oxide layer, the first insulating layer is thicker than the second insulating layer, and the light-shielding layer is thicker than the first insulating layer.

14. The photoelectric conversion device according to claim 1, wherein:
the metal oxide layer has a thickness of 5 nm to 20 nm;
the first insulating layer has a thickness of 70 nm to 280 nm;

the second insulating layer has a thickness of 25 nm to 100 nm; and the light-shielding layer has a thickness of 100 nm to 400 nm.

15. The photoelectric conversion device according to claim 1, wherein a dielectric layer is arranged between the metal oxide layer and the first insulating layer.

16. The photoelectric conversion device according to claim 15, wherein the dielectric layer is thicker than the metal oxide layer.

17. The photoelectric conversion device according to claim 15, wherein the dielectric layer is formed of tantalum oxide.

18. An apparatus comprising: the photoelectric conversion device according to claim 1 and at least one device selected from the group consisting of:

an optical system that forms an image on the photoelectric conversion device;

a control device that controls the photoelectric conversion device, a processing device that processes a signal output from the photoelectric conversion device;

a display device that displays information obtained by the photoelectric conversion device;

a storage device that stores the information obtained by the photoelectric conversion device; and a mechanical device with a moving part or a propulsion part.

19. The photoelectric conversion device according to claim 1, wherein light enters the semiconductor layer from the side of the first surface.

20. The photoelectric conversion device according to claim 1, wherein:

a third insulating layer is arranged between the second insulating layer and the light-shielding layer in the second layered structure; and a dielectric layer is arranged between the metal oxide layer and the first insulating layer in the second layered structure.

21. The photoelectric conversion device according to claim 1, wherein the first layered structure includes the second insulating layer.

22. The photoelectric conversion device according to claim 1, wherein an element is provided in the substrate.

* * * * *